US012628691B2

(12) United States Patent
Wang et al.

(10) Patent No.: US 12,628,691 B2
(45) Date of Patent: May 12, 2026

(54) DISPLAY SUBSTRATE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Rong Wang, Beijing (CN); Bo Zhang, Beijing (CN); Qian Ma, Beijing (CN); Xiangdan Dong, Beijing (CN); Xiaoqing Shu, Beijing (CN); Yagui Gao, Beijing (CN); Erlong Song, Beijing (CN); Jiaxing Zhao, Beijing (CN); Yuting Fu, Beijing (CN); Chengchu Tseng, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 916 days.

(21) Appl. No.: 17/906,061

(22) PCT Filed: Oct. 22, 2021

(86) PCT No.: PCT/CN2021/125558
§ 371 (c)(1),
(2) Date: Sep. 9, 2022

(87) PCT Pub. No.: WO2022/217880
PCT Pub. Date: Oct. 20, 2022

(65) Prior Publication Data
US 2024/0213425 A1　Jun. 27, 2024

(30) Foreign Application Priority Data
Apr. 15, 2021　(CN) .......................... 202110427389.8

(51) Int. Cl.
*H10W 90/00* (2026.01)
*G09G 3/32* (2016.01)
(Continued)

(52) U.S. Cl.
CPC .............. *H10W 90/00* (2026.01); *G09G 3/32* (2013.01); *H10H 20/857* (2025.01);
(Continued)

(58) Field of Classification Search
CPC .................... H01L 25/167; G09G 3/32; G09G 2310/0267; H10H 20/857; H10H 29/142;
(Continued)

(56) References Cited

U.S. PATENT DOCUMENTS 8,431,452 B2　4/2013　Hou et al.
9,136,315 B1 *　9/2015　Kim .................... H10K 59/124
(Continued)

FOREIGN PATENT DOCUMENTS

CN　101630098 A　1/2010
CN　102709239 A　10/2012
(Continued)

OTHER PUBLICATIONS

International Search Report and Written Opinion dated Jan. 17, 2022, for corresponding PCT Application No. PCT/CN2021/125558.
(Continued)

*Primary Examiner* — Victor A Mandala
(74) *Attorney, Agent, or Firm* — Kinney & Lange, P.A.

(57) ABSTRACT

A display substrate and a display device are provided. The display substrate includes a plurality of pads, an insulating layer and an inorganic layer located in a peripheral region. At least one of the pads includes a first conductor portion, a second conductor portion and a third conductor portion. The third conductor portion is located on a side of the second (Continued)

conductor portion away from abase substrate and electrically connected to the second conductor portion. The third conductor portion is electrically connected to the second conductor portion through a second via hole disposed in the inorganic layer of the peripheral region. A projection of the first conductor portion on the base substrate is located within a projection of the second via hole on the base substrate.

18 Claims, 12 Drawing Sheets

(51) Int. Cl.
| | | |
|---|---|---|
| *H10H 20/857* | (2025.01) |
| *H10H 29/14* | (2025.01) |
| *H10K 59/00* | (2023.01) |

(52) U.S. Cl.
CPC ... *H10H 29/142* (2025.01); *G09G 2310/0267* (2013.01); *H10K 59/00* (2023.02)

(58) Field of Classification Search
CPC ...... H10K 59/00; H10K 59/40; H10K 59/131; H10D 30/67
See application file for complete search history.

(56) References Cited

U.S. PATENT DOCUMENTS

| | | | |
|---|---|---|---|
| 9,236,405 | B2 | 1/2016 | Liu |
| 9,917,111 | B2 | 3/2018 | Liu |
| 10,522,608 | B2 | 12/2019 | Park et al. |
| 10,679,561 | B2 | 6/2020 | Kim et al. |
| 11,043,550 | B2 | 6/2021 | Park et al. |
| 11,348,527 | B2 | 5/2022 | Kim et al. |
| 2010/0012946 | A1 | 1/2010 | Zhi et al. |
| 2010/0045912 | A1 | 2/2010 | Chen et al. |
| 2014/0061635 | A1 | 3/2014 | Liu |
| 2016/0043101 | A1* | 2/2016 | Liu ...................... H10D 86/441 |
| | | | 257/774 |
| 2016/0307971 | A1 | 10/2016 | Jeon |
| 2016/0322451 | A1* | 11/2016 | Park ...................... G09G 3/006 |
| 2017/0262109 | A1* | 9/2017 | Choi .................... H10D 86/411 |
| 2018/0158894 | A1 | 6/2018 | Park et al. |
| 2021/0028272 | A1* | 1/2021 | Won .................... H10D 86/451 |
| 2021/0242284 | A1* | 8/2021 | Kim .................... G06F 3/0412 |
| 2022/0320851 | A1 | 10/2022 | Cai et al. |
| 2022/0415992 | A1* | 12/2022 | Park ...................... H10K 50/88 |

FOREIGN PATENT DOCUMENTS

| | | |
|---|---|---|
| CN | 103681696 A | 3/2014 |
| CN | 106057853 A | 10/2016 |
| CN | 108153017 A | 6/2018 |
| CN | 109427752 A | 3/2019 |
| CN | 111785757 A | 10/2020 |
| CN | 111863916 A | 10/2020 |
| CN | 215955282 U | 3/2022 |

OTHER PUBLICATIONS

First Office Action dated Dec. 3, 2024, for corresponding Chinese Patent Application No. 202110427389.8, 19 pgs.

* cited by examiner

DISPLAY SUBSTRATE AND DISPLAY DEVICE

CROSS REFERENCE TO RELATED APPLICATION(S)

This application is a National Stage Application of International Application No. PCT/CN2021/125558, filed on Oct. 22, 2021, entitled "DISPLAY PANEL AND DISPLAY DEVICE", which claims priority to Chinese Patent Application No. 202110427389.8, filed on Apr. 15, 2021, which are incorporated herein in their entirety by reference.

TECHNICAL FIELD

The present disclosure relates to a field of display technology, and in particular to a display substrate and a display device.

BACKGROUND

With the development of display technology, the requirements for display panels are getting higher and higher. A display substrate usually includes a plurality of pads having a plurality of layers. During the manufacturing process of the display substrate, bonding the pad with another circuit may easily cause cracking or peeling of the layer(s) of the pad, thereby affecting the display effect.

SUMMARY

Embodiments of the present disclosure provide a display substrate, including:

a base substrate including a display region and a peripheral region surrounding the display region;

a plurality of sub-pixels located in the display region and arranged in an array;

a plurality of pads located in the peripheral region, wherein at least one of the plurality of pads includes a first conductor portion, a second conductor portion and a third conductor portion, the first conductor portion is located on the base substrate, the second conductor portion is located on a side of the first conductor portion away from the base substrate and electrically connected to the first conductor portion, and the third conductor portion is located on a side of the second conductor portion away from the base substrate and electrically connected to the second conductor portion;

an insulating layer of the peripheral region, wherein the insulating layer of the peripheral region is located in the peripheral region, and the second conductor portion is electrically connected to the first conductor portion through a first via hole disposed in the insulating layer of the peripheral region; and an inorganic layer of the peripheral region, wherein the inorganic layer of the peripheral region is located in the peripheral region, the third conductor portion is electrically connected to the second conductor portion through a second via hole disposed in the inorganic layer of the peripheral region, and a projection of the first conductor portion on the base substrate is located within a projection of the second via hole on the base substrate.

For example, the display substrate further includes:

a planarization layer of the peripheral region, wherein the planarization layer of the peripheral region is located on a side of the inorganic layer of the peripheral region facing the base substrate, and the inorganic layer of the peripheral region is in contact with the second conductor portion through a third via hole disposed in the planarization layer of the peripheral region.

For example, the plurality of pads include a plurality of input pads arranged along a first direction in a peripheral region on a side of the display region, wherein the first direction is a row direction of the array of the plurality of sub-pixels; and a plurality of output pads located between the plurality of input pads and the display region and arranged along the first direction.

For example, the display substrate further includes:

a plurality of connection pads located in the peripheral region, wherein on a side of the plurality of input pads away from the display region, the first conductor portion of the input pad is electrically connected to the connection pad through a first lead disposed in the peripheral region; and a gate driving circuit located in a peripheral region on at least another side of the display region, wherein the gate driving circuit is connected to the plurality of sub-pixels and configured to provide a gate driving signal to the plurality of sub-pixels, wherein the first conductor portion of the output pad is electrically connected to the gate driving circuit or at least one of the plurality of sub-pixels through a second lead disposed in the peripheral region.

For example, the connection pad includes:

a fourth conductor portion located on the base substrate and disposed in the same layer as the second conductor portion;

a fifth conductor portion located on a side of the fourth conductor portion away from the base substrate and disposed in the same layer as the third conductor portion, wherein the fifth conductor portion is electrically connected to the fourth conductor portion through a fourth via hole disposed in the inorganic layer of the peripheral region; and a pad insulating portion located on a side of the inorganic layer of the peripheral region facing the base substrate, wherein the pad insulating portion covers an edge of the fourth conductor portion.

For example, the display substrate further includes a planarization layer of the peripheral region, wherein the inorganic layer of the peripheral region is in contact with the fourth conductor portion through a fifth via hole disposed in the planarization layer of the peripheral region, and the pad insulating portion is disposed in the same layer as the planarization layer of the peripheral region.

For example, an edge of the projection of the first conductor portion on the base substrate is spaced from an edge of the projection of the second via hole on the base substrate by a distance of 1 μm to 2 μm.

For example, a geometric center of the projection of the first conductor portion on the base substrate substantially coincides with a geometric center of the projection of the second via hole on the base substrate, a size of the projection of the first conductor portion on the base substrate in a first direction is in a range of 12 μm to 14 μm, a size of the projection of the second via hole on the base substrate in the first direction is in a range of 14 μm to 16 μm, and the first direction is a row direction of the array of the plurality of sub-pixels.

For example, a size of the projection of the second conductor portion on the base substrate in a first direction is in a range of 19 μm to 21 μm, a size of the projection of the third conductor portion on the base substrate in a first direction is in a range of 20 μm to 22 μm, and the first direction is a row direction of the array of the plurality of sub-pixels.

For example, a size of a projection of the third via hole on the base substrate in a first direction is in a range of 16 μm to 20 μm.

For example, a size of a projection of the first via hole on the base substrate in a first direction is in a range of 7 μm to 9 μm.

For example, a size of the projection of the third conductor portion on the base substrate in a first direction is in a range of 20 μm to 22 μm, and a size of the projection of the third conductor portion on the base substrate in a second direction is in a range of 140 μm to 150 μm.

For example, a sidewall of the second via hole in the inorganic layer of the peripheral region has a slope angle $\theta 1$ with respect to a plane where the base substrate is located;

an edge of the first conductor portion has a first surface facing the base substrate, a second surface away from the base substrate and a third surface connecting the first surface to the second surface, the third surface of the first conductor portion has a slope angle $\theta 2$ with respect to the plane where the base substrate is located; wherein $\theta 2 < \theta 1$.

For example, the slope angle $\theta 1$ is in a range of 80° to 90°, and the slope angle $\theta 2$ is in a range of 20° to 30°.

For example, an edge of the second conductor portion has a first surface facing the base substrate, a second surface away from the base substrate and a third surface connecting the first surface to the second surface, and the third surface of the second conductor portion has a slope angle $\theta 3$ with respect to a plane where the base substrate is located;

wherein an edge of the third conductor portion has a first surface facing the base substrate, a second surface away from the base substrate and a third surface connecting the first surface to the second surface, and the third surface of the third conductor portion has a slope angle $\theta 4$ with respect to the plane where the base substrate is located;

wherein a sidewall of the first via hole in the insulating layer of the peripheral region has a slope angle $\theta 5$ with respect to the plane where the base substrate is located; and wherein $\theta 5 < \theta 3 < \theta 4$.

For example, the slope angle $\theta 3$ is in a range of 55° to 65°, the slope angle $\theta 4$ is in a range of 58° to 67°, and the slope angle $\theta 5$ is in a range of 40° to 50°.

For example, the projection of each of the first conductor portion, the second conductor portion, the third conductor portion, the first via hole and the second via hole on the base substrate has a shape of rectangle or parallelogram.

For example, at least one of the plurality of sub-pixels includes a thin film transistor having a gate electrode, a source electrode and a drain electrode, the first conductor portions of the plurality of pads are disposed in the same layer as the gate electrode, and the second conductor portions of the plurality of pads are disposed in the same layer as the source electrode and the drain electrode.

For example, the display substrate further includes a light-emitting element, an encapsulation layer, a first touch electrode layer, a second touch electrode layer and a touch insulating layer that are located in the display region, wherein the light-emitting element is located on a side of the thin film transistor away from the base substrate, the encapsulation layer is located on a side of the light-emitting element away from the base substrate, the first touch electrode layer is located on a side of the encapsulation layer away from the base substrate, the touch insulating layer is located on a side of the first touch electrode layer away from the base substrate and covers the first touch electrode layer, the second touch electrode layer is located on a side of the touch insulating layer away from the base substrate;

wherein the inorganic layer of the peripheral region is disposed in the same layer as the touch insulating layer, and the third conductor portion is disposed in the same layer as at least one of the first touch electrode layer and the second touch electrode layer.

For example, the at least one of the plurality of sub-pixels further includes an interlayer insulating layer of the display region, a first gate insulating layer of the display region and a second gate insulating layer of the display region, the interlayer insulating layer of the display region is located between the gate electrode and the source electrode and drain electrode, the first gate insulating layer of the display region is located on a side of the interlayer insulating layer of the display region facing the base substrate, and the second gate insulating layer of the display region is located between the interlayer insulating layer of the display region and the first gate insulating layer of the display region; and wherein the insulating layer of the peripheral region includes an interlayer insulating layer of the peripheral region and a second gate insulating layer of the peripheral region, the interlayer insulating layer of the peripheral region is disposed in the same layer as the interlayer insulating layer of the display region, and the second gate insulating layer of the peripheral region is disposed in the same layer as the second gate insulating layer of the display region.

For example, at least one of the plurality of sub-pixels includes a thin film transistor and a transfer electrode, the thin film transistor includes a gate electrode, a source electrode and a drain electrode, the transfer electrode is electrically connected to one of the source electrode and the drain electrode, and the second conductor portion is disposed in the same layer as at least one of the source electrode and drain electrode and the transfer electrode.

The embodiments of the present disclosure further provide a display device including the above-mentioned display substrate.

DETAILED DESCRIPTION OF EMBODIMENTS

Although the drawings containing a preferred embodiment of the present disclosure will be referred to fully describe the present disclosure, before that, it should be understand that those skilled in the art may modify a described present disclosure in this article, and obtain a technical effect of the present disclosure. Therefore, it should be understand the above description is a wide range of disclosure for those skilled in the art, and its content is not to restrict an exemplary embodiment described in the present disclosure.

In addition, in the detailed description below, in order to facilitate explanation, many specific details are explained to provide a comprehensive understanding of the embodiments of the present disclosure. However, it is obvious that one or more embodiments may be implemented without these specific details. In other cases, well-known structures and devices are presented in a form of an icon to simplify the drawings.

Figure 1A:
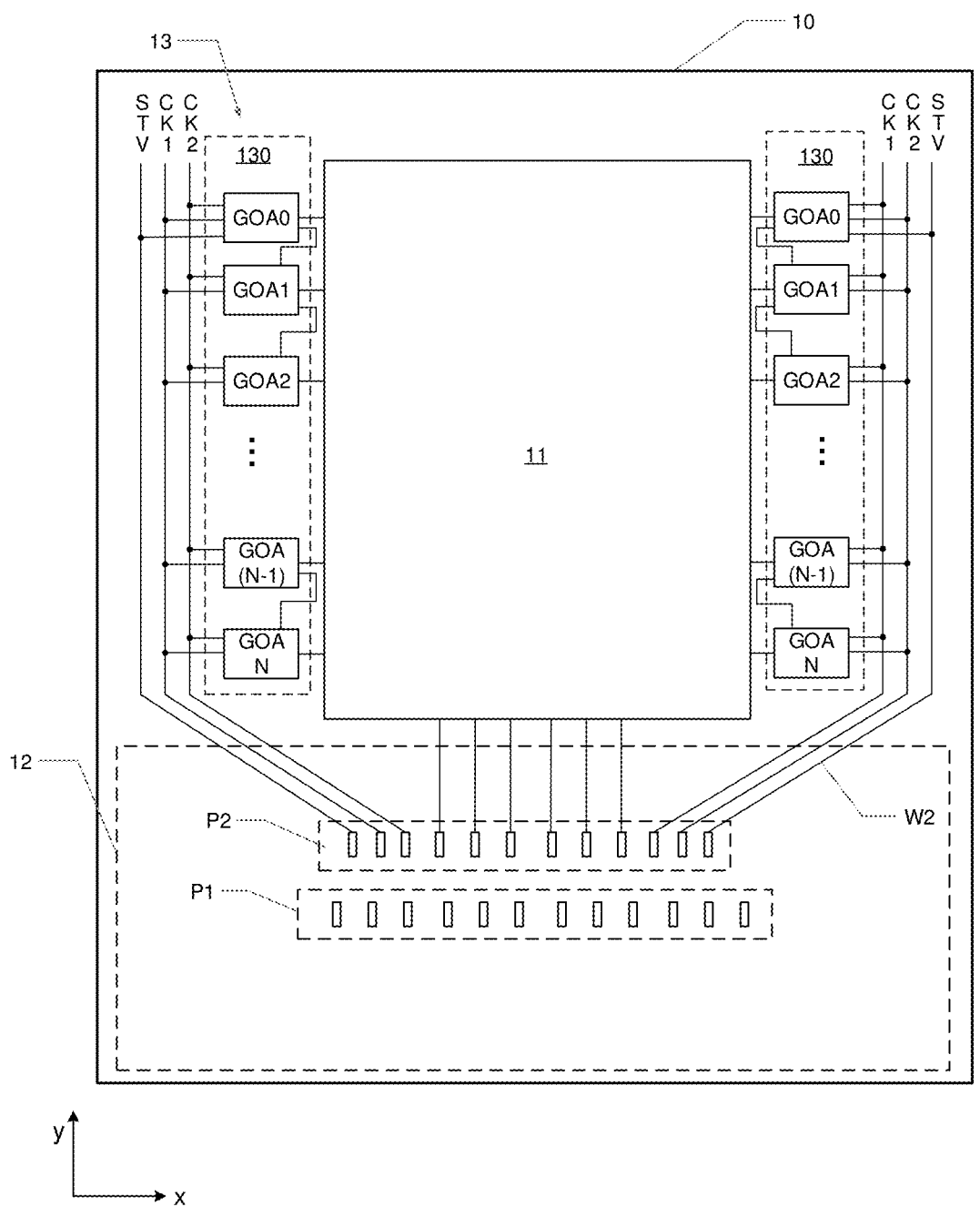
FIG. 1A shows a schematic plan view of a display substrate according to an embodiment of the present disclosure.
Figure 1B:
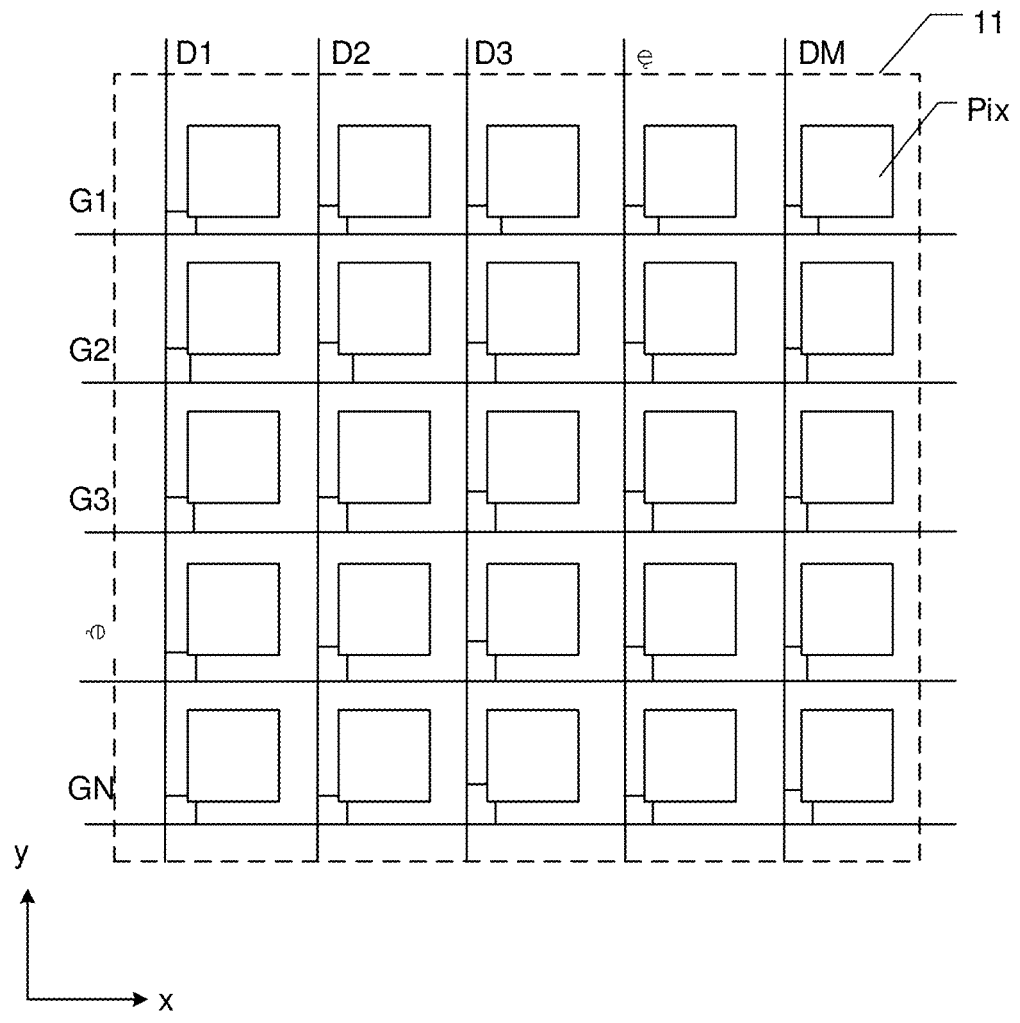
FIG. 1B shows a schematic plan view of a display region of the display substrate of FIG. 1A.

FIG. 1A shows a schematic plan view of a display substrate according to an embodiment of the present disclosure. FIG. 1B shows a schematic plan view of a display region of the display substrate of FIG. 1A.

As shown in FIG. 1A, the display substrate includes a base substrate 10. The base substrate 10 includes a display region 11 and a peripheral region surrounding the display region 11. For example, in FIG. 1A, the peripheral region includes a periphery region 12 (also referred to as a bonding region) located on at least one side of the display region 11 and a peripheral region 13 (also referred to as a side region) on at least another side of the display region. In FIG. 1A, the bonding region 12 is located on one side of the display region 11 along a direction y. The side region 13 is located on two sides of the display region 11 along a direction x. A plurality of sub-pixels Pix are provided in the display region 11. The plurality of sub-pixels Pix may be arranged in an array. In FIG. 1A and FIG. 1B, x represents a row direction of the array of sub-pixels, and y represents a column direction of the array of sub-pixels. A plurality of gate lines G1 to GN and a plurality of data lines D1 to DM are further provided in the display region 11. Each of the gate lines G1 to GN is connected to at least one row of sub-pixels Pix to provide a gate driving signal to the row of sub-pixels Pix. Each of the data lines D1 to DM is connected to at least one column of sub-pixels Pix to provide a data signal to the column of sub-pixels Pix. Each sub-pixel Pix may be turned on under control of the gate driving signal on the gate line connected to this sub-pixel. The turned on sub-pixel Pix may emit light under the drive of the data signal on the data line connected to this turned on sub-pixel Pix.

A gate driving circuit 130 is located in the side region 13. There are two gate driving circuits 130 in FIG. 1, which are respectively located in the side region 13 on two sides of the display region 11. The gate driving circuit 130 is connected to the plurality of sub-pixels Pix. In FIG. 1A and FIG. 1B, the gate driving circuit 130 is connected to a plurality rows of sub-pixels Pix through the plurality of gate lines G1 to GN to provide a gate driving signal to each row of sub-pixels Pix, respectively. As shown in FIG. 1A, the gate driving circuit 130 is further connected to various driving control signal lines, such as a first clock signal line CK1 for providing a first clock signal, a second clock signal line CK2 for providing a second clock signal and a startup signal line STV for providing a start signal. The gate driving circuit 130 may include shift registers GOA0 to GOAN which are cascaded into multiple stages. Each of the shift registers GOA0 to GOAN is connected to a corresponding driving control signal line to generate a gate driving signal under control of the driving control signal and provide the gate driving signal to sub-pixels Pix of the display region 11.

A plurality of pads is provided in the peripheral region. For example, in FIG. 1A, the plurality of pads include a plurality of input pads P1 and a plurality of output pads P2, both of which are located in the bonding region 12. The plurality of output pads P2 are located between the plurality of input pads P1 and the display region 11. In FIG. 1A, the plurality of input pads P1 and the plurality of output pads P2 are arranged in at least one row along a first direction. The first direction is a direction along which a side of the display region 11 facing the bonding region 12 extends, that is, the direction x.

The plurality of output pads P2 are electrically connected to the sub-pixels Pix in the display region 11 and the gate driving circuit 130. For example, the plurality of output pads P2 may be respectively connected to the sub-pixels Pix in the display region 11 and the gate driving circuit 130 through a plurality of second leads W2. As shown in FIG. 1A, the plurality of output pads P2 on a left side and a right side are respectively connected to the first clock signal lines CK1, the second clock signal lines CK2, and the startup signal lines STV through second leads W2, in order to connect to the gate driving circuit 130. In FIG. 1A, the output pads P2 in the middle are respectively connected to the data lines D1 to DM in the display region 11 through the plurality of second leads W2, in order to connect to the sub-pixels Pix in the display region 11. In some embodiments, structures such as a cell test (CT) circuit, an electro-static discharge (ESD) circuit and a multiplexing circuit may be disposed in the bonding region 12. For example, the cell test circuit may be disposed in a region between the plurality of output pads P2 and the display region 11. The cell test circuit may be connected to a plurality of test signal lines and the plurality of sub-pixels in the display region. For example, the multiplexing circuit may be disposed in a region between the cell test circuit and the plurality of output pads P2. The multiplexing circuit may be connected to the data lines in the display region 11 and at least one of the output pads P2, to multiplex a data signal provided by the output pad(s) P2 and provide the multiplexed signal to the data lines in the display region 11 The embodiments of the present disclosure are not limited thereto. In some embodiments, at least one of the cell test circuit, the electro-static discharge circuit, the multiplexing circuit and other auxiliary circuits may be disposed in a region between the input pads P1 and the output pads P2.

When connecting a control chip to the display substrate, the input pads P1 are connected to input pins of the control chip, and the output pads P2 are connected to output pins of the control chip. Signal(s) (for example but not limited to a power signal, a control signal, etc.) provided by the flexible circuit board is/are provided to the control chip through the input pads P1, so that the control chip generates driving signal(s) (for example but not limited to a clock signal, a startup signal, a data signal, etc.). The driving signal(s) generated by the control chip is/are provided to the sub-pixels Pix in the display region 11 and/or the gate driving circuit 130 through the output pads P2. For example, the data signal generated by the control chip is provided to the data lines D1 to DM through the output pads P2 located in the middle portion, in order to provide the data signal to the sub-pixels in the display region 11. The first clock signal, the second clock signal and the startup signal generated by the control chip are respectively provided to the first clock signal lines CK1, the second clock signal lines CK2 and the startup signal lines STV through the output pads P2 located on two sides of the control chip, in order to provide the first clock signal, the second clock signal and the startup signal to the gate driving circuit 130.

Figure 2A:
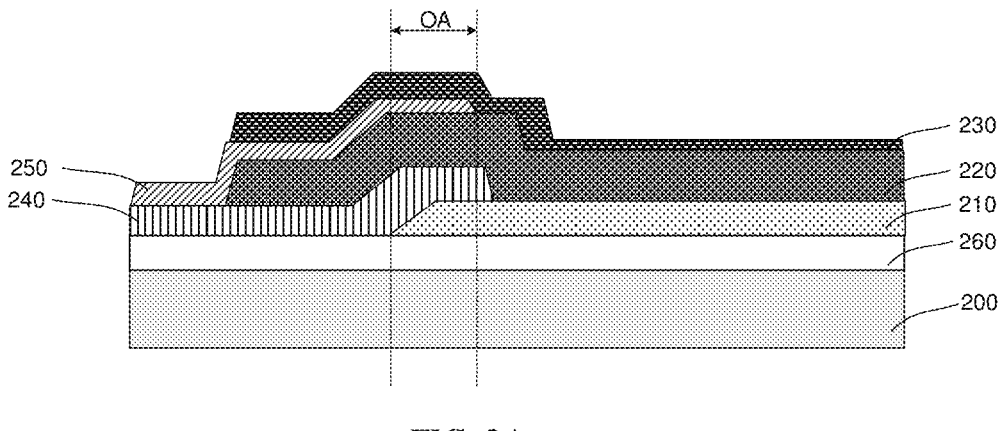
FIG. 2A shows a schematic diagram of a cross section of a pad of a display substrate.
Figure 2B:
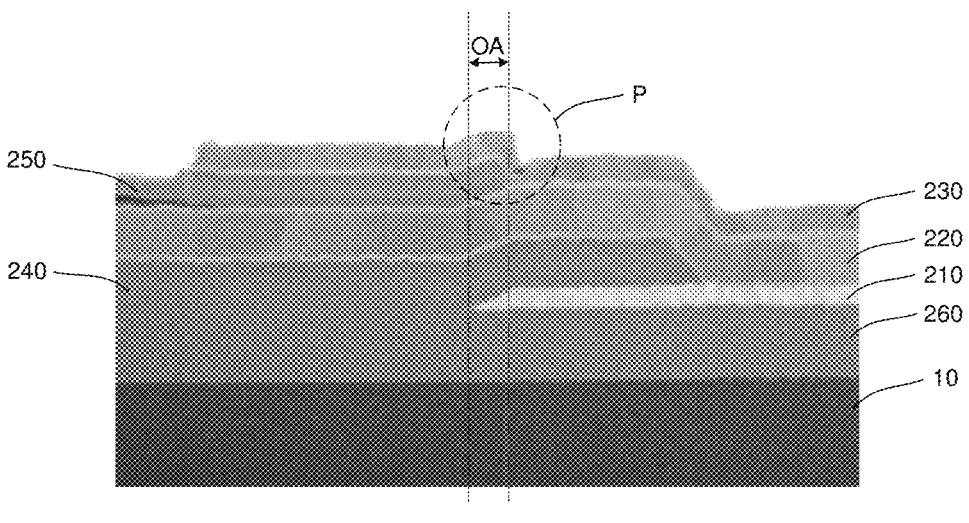
FIG. 2B shows a scanning electron microscope image of the pad of FIG. 2A.

FIG. 2A shows a schematic diagram of a cross section of a pad of a display substrate. FIG. 2B shows a scanning electron microscope image of the pad of FIG. 2A.

As shown in FIG. 2A, the pad includes conductor layers 210, 220 and 230 sequentially stacked on a base substrate 200. An insulating layer 240 is located between the conductor layers 210 and 220. An inorganic layer 250 is located between the conductor layers 220 and 230. A gate insulating layer 260 is located between the conductor layer 210 and the base substrate 200. The conductor layer 220 is electrically connected to the conductor layer 210 through a via hole in the insulating layer 240. The conductor layer 230 is electrically connected to the conductor layer 220 through a via hole in the inorganic layer 250. A projection of the conductor layer 210 on the base substrate 200 at least partially overlaps with a projection of the inorganic layer 250 on the base substrate 200, wherein the overlapping area is denoted by "OA" in FIG. 2A. As shown in FIG. 2B, due to the overlapping area OA, a protrusion P is formed in the conductor layer 230 in a direction perpendicular to the base substrate 200, thereby causing the third conductor portion 230 to have a large metal level difference. Due to the metal level difference, the layer is prone to crack during a bonding process of the display substrate and the control chip (IC). The cracked part forms a channel through which moisture may intrude. However, the control chip is usually in form of an integral metal that cannot release the moisture in time, resulting peeling of the reliable IC, thereby resulting fault displaying.

The present disclosure provides the display substrate. Since the inorganic layer of the peripheral region is spaced from the first conductor portion by a specific interval, the surface of the pad may be relatively flat, thereby reducing the occurrence of the layer crack.

Figure 3:
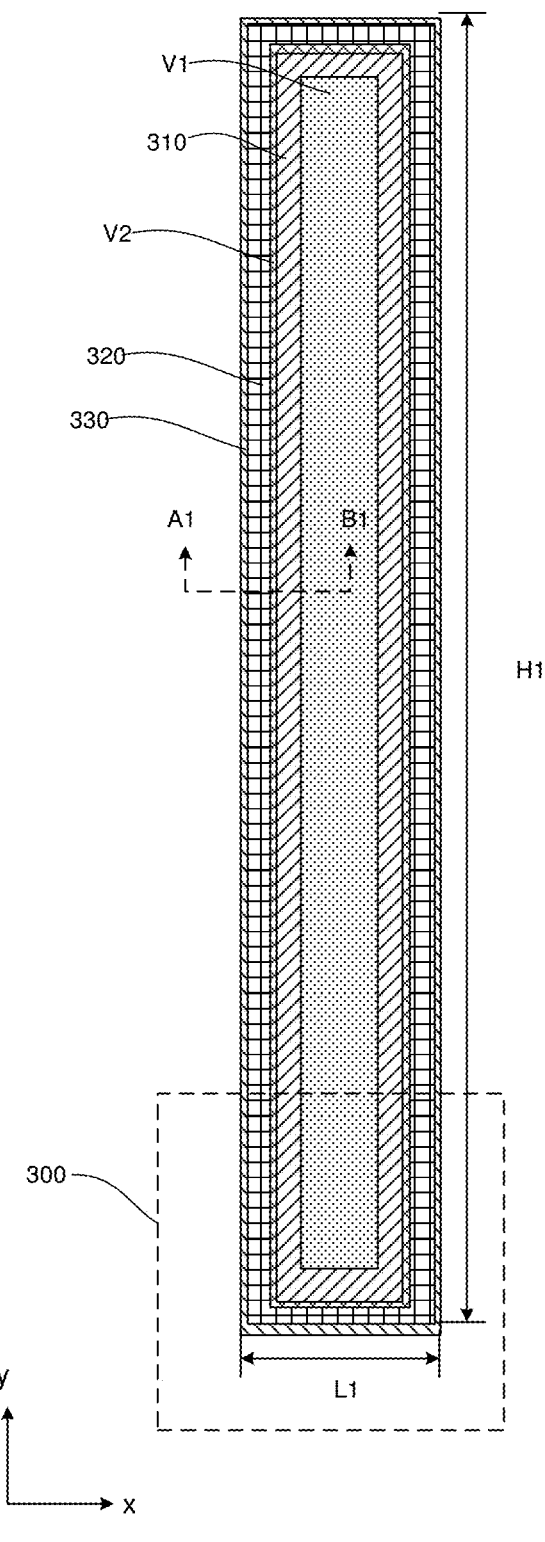
FIG. 3 shows a schematic plan view of a pad of the display substrate of FIG. 1.
Figure 4A:
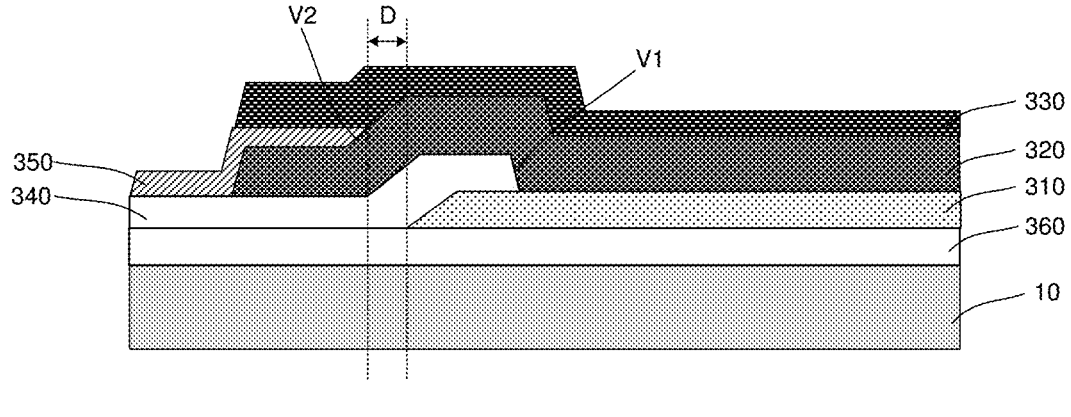
FIG. 4A shows a cross-sectional view along A1-B1 in FIG. 3.
Figure 4B:
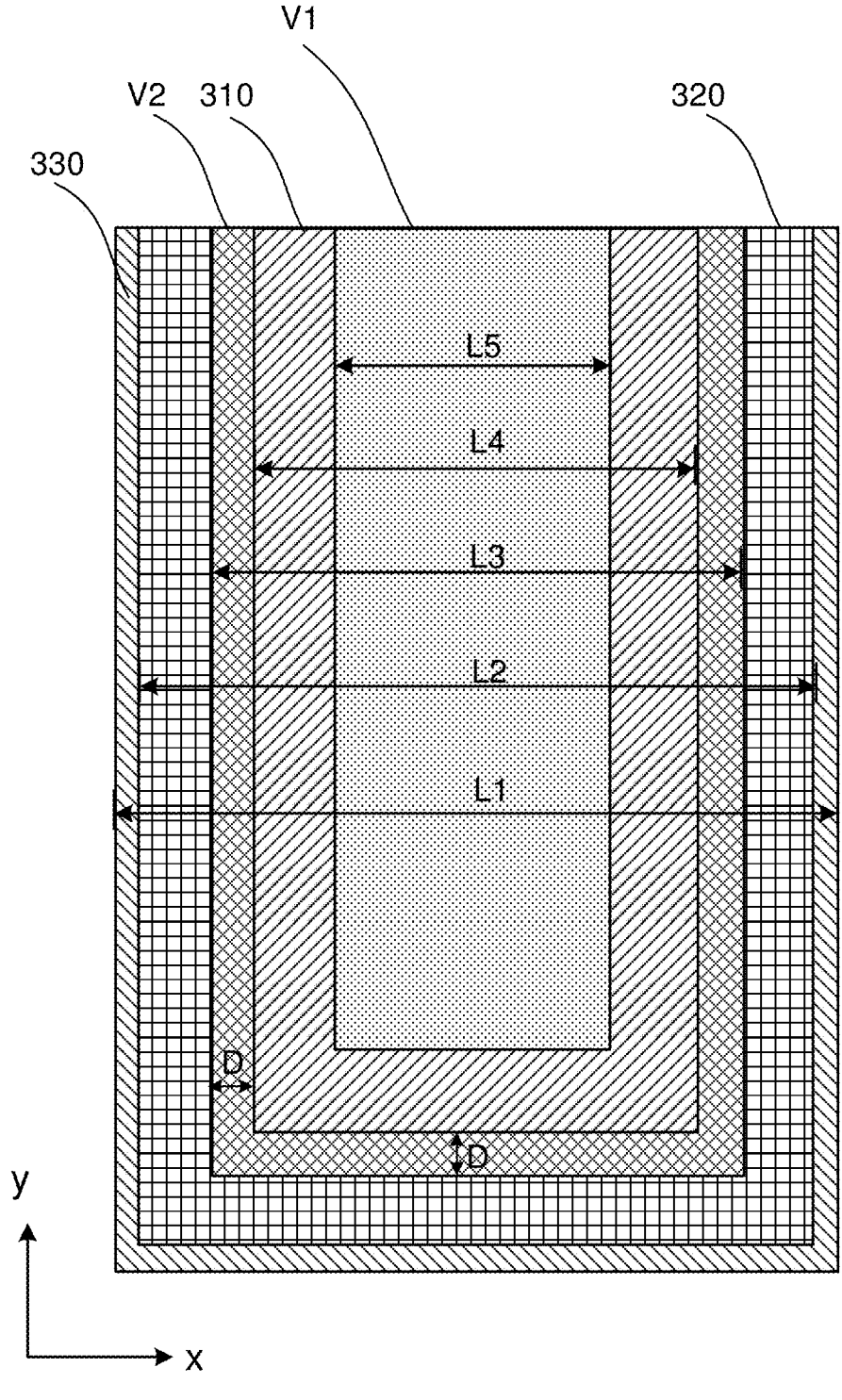
FIG. 4B shows a partial enlarged view of FIG. 3.
Figure 4C:
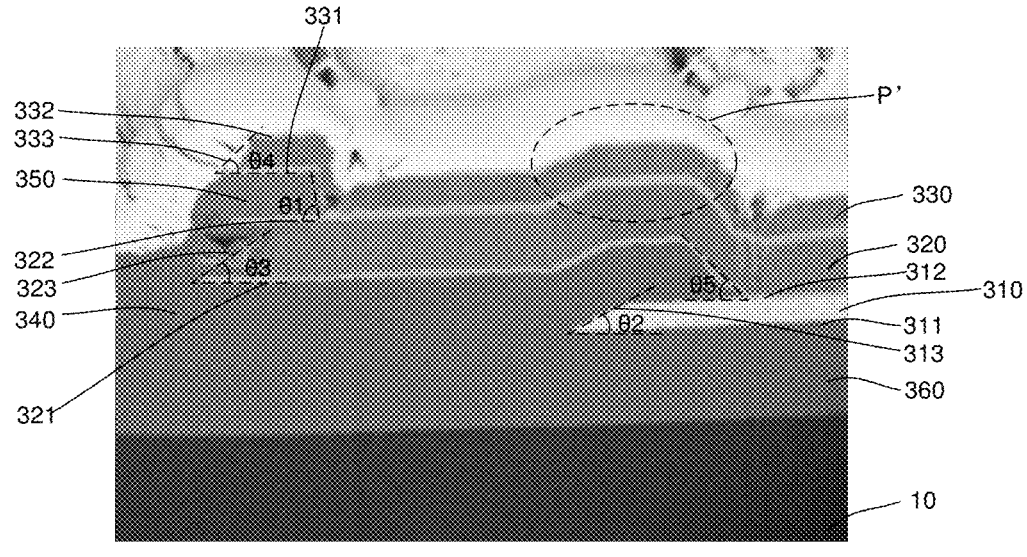
FIG. 4C shows a scanning electron microscope image corresponding to the cross-sectional view in FIG. 4A.

FIG. 3 shows a schematic plan view of a pad of the display substrate of FIG. 1. FIG. 4A shows a cross-sectional view along A1-B1 in FIG. 3. FIG. 4B shows a partial enlarged view of FIG. 3. FIG. 4C shows a scanning electron microscope image corresponding to the cross-sectional view in FIG. 4A.

A pad shown in FIG. 3 may be any one of the input pads P1 and the output pads P2. As shown in FIG. 3 and FIG. 4A, the pad includes a first conductor portion 310, a second conductor portion 320 and a third conductor portion 330. The first conductor portion 310 is located on the base substrate 10. The second conductor portion 320 is located on a side of the first conductor portion 310 away from the base substrate 10 and is electrically connected to the first conductor portion 310. The third conductor portion 330 is located on a side of the second conductor portion 320 away from the base substrate 10 and is electrically connected to the second conductor portion 320. Referring to FIG. 1A, the first conductor portion 310 of the output pad P2 may be connected to the second lead W2 of the bonding region, thereby being electrically connected to the gate driving circuit 130 or at least one of the plurality of sub-pixels in the display region 11. The first conductor portion 310 of the input pad P1 may be connected to a connection pad to be connected to an external circuit, which will be described in further detail below. A size L1 of a projection of the pad on the base substrate 10 in the first direction (i.e. direction x) is in a range of 20 μm to 22 μm, for example, may be about 21.5 μm. A size H1 of the projection of the pad on the base substrate 10 in a second direction (i.e. direction y) is in a range of 140 μm to 150 μm, for example, may be about 145 μm. In some embodiments, the size of the pad may be defined by a size of the third conductor portion 330, which will be described in further detail below.

As shown in FIG. 4A, an insulating layer 340 of the peripheral region and an inorganic layer 350 of the peripheral region are further provided in the bonding region 12 of the display substrate. The second conductor portion 320 is electrically connected to the first conductor portion 310 through a first via hole V1 disposed in the insulating layer 340 of the peripheral region. The third conductor portion 330 is electrically connected to the second conductor portion 320 through a second via hole V2 disposed in the inorganic layer 350 of the peripheral region.

As shown in FIG. 4A, a first gate insulating layer 360 of the peripheral region may further be provided in the bonding region 12 of the display substrate. The first gate insulating layer 360 of the peripheral region is disposed between the first conductor portion 310 and the base substrate 10.

In some embodiments, the insulating layer 340 of the peripheral region may include a second gate insulating layer of the peripheral region and an interlayer dielectric layer of the peripheral region. The material of each of the first gate insulating layer 360 of the peripheral region, the second gate insulating layer of the peripheral region and the interlayer dielectric layer of the peripheral region may include but not limited to inorganic insulating materials such as silicon oxide, silicon nitride, and silicon oxynitride. However, the embodiments of the present disclosure are not limited thereto. In other embodiments, the material of each of the first gate insulating layer 360 of the peripheral region, the second gate insulating layer of the peripheral region and the interlayer dielectric layer of the peripheral region may include but not limited to organic insulating materials such as polyimide, polyphthalimide, polyphthalamide, acrylic resin, benzocyclobutene or phenolic resin. Materials of the first conductor portion 310, the second conductor portion 320 and the third conductor portion 330 may include a metal material or an alloy material, such as but not limited to a metal single-layer or a multi-layer structure formed of molybdenum, aluminum, and titanium.

In some embodiments, the base substrate 10 may include organic materials, such as one or more of resin materials including polyimide, polycarbonate, polyacrylate, polyetherimide, polyethersulfone, polyethylene terephthalate and polyethylene naphthalene ethylene dicarboxylate. The base substrate 10 may be a flexible substrate or a non-flexible substrate.

As shown in FIG. 3 and FIG. 4A, a projection of the first conductor portion 310 on the base substrate 10 is located within a projection of the second via hole V2 of the inorganic layer 350 of the peripheral region on the base substrate 10. As shown in FIG. 4A, an edge of the projection of the first conductor portion 310 on the base substrate 10 is spaced from an edge of the projection of the second via V2 on the base substrate 10 by a distance D. In some embodiments, the distance D is in a range of 1 μm to 2 μm, for example, may be about 1.5 μm.

As shown in FIG. 3 and FIG. 4B, a size L5 of a projection of the first via hole V1 in the insulating layer 340 of the peripheral region on the base substrate 10 in the first direction (direction x) is in a range of 7 μm to 9 μm, for example, may be about 8 μm. A size L4 of a projection of the first conductor portion 310 on the base substrate 10 in the first direction is in a range of 12 μm to 14 μm, for example, may be about 13 μm. A size L3 of a projection of the second via hole V2 in the inorganic layer 350 of the peripheral region on the base substrate 10 in the first direction is in a range of 14 μm to 16 μm, for example, may be about 15.5 μm. As shown in FIG. 3 and FIG. 4B, a geometric center of the projection of the first conductor portion 310 on the base substrate 10 may substantially coincide with a geometric center of the projection of the second via hole V2 on the base substrate 10. In an actual manufacturing process of the display substrate, certain process errors will be generated due to process fluctuations, so that there is a certain deviation between the geometric center of the projection of the first conductor portion 310 and the geometric center of the projection of the second via hole V2. The so-called "substantially coincide" here means that the deviation is allowed. A size L2 of a projection of the second conductor portion 320 on the base substrate 10 in the first direction is in a range of 19 μm to 21 μm, for example, may be about 20 μm. A size L1 of a projection of the third conductor portion 330 on the base substrate 10 in the first direction is in a range of 20 μm to 22 μm, for example, may be about 21.5 μm. In some embodiments, a size of the projection of the third conductor portion 330 on the base substrate 10 in the second direction is in a range of 140 μm to 150 μm.

As shown in FIG. 3 in combination with FIG. 4B, in some embodiments, the edges of the projections of any two of the first conductor portion 310, the second conductor portion 320, the third conductor portion 330, the first via hole V1 and the second via hole V2 on the base substrate 10 are spaced from each other by a distance in the direction x and by a distance in the direction y, which is equal to the distance in the direction x. For example, the distance between the edge of the projection of the first conductor portion 310 and the edge of the projection of the second via hole V2 in the direction x and the distance between the edge of the projection of the first conductor portion 310 and the edge of the projection of the second via hole V2 in the direction y may both be D. It is also possible for other conductor portions and other via holes to have equal or unequal distances from each other in the directions x and y, which will not be repeated here.

As shown in FIG. 3 in combination with FIG. 4C, an edge of the first conductor portion 310 has a first surface 311 facing the base substrate 10, a second surface 312 away from the base substrate 10, and a third surface 313 connecting the first surface 311 to the second surface 312. The third surface 313 of the first conductor portion 310 has a slope angle θ2 in a range of 20° to 30° with respect to a plane where the base substrate 10 is located. For example, θ2 may be in a range of 20° to 25°. In some embodiments, θ2 may be about 23°.

A sidewall of the first via hole V1 in the insulating layer 340 of the peripheral region has a slope angle θ5 in a range of 40° to 50° with respect to the plane where the base substrate 10 is located. For example, θ5 may be in a range of 45° to 50°. In some embodiments, θ5 may be about 47°.

An edge of the second conductor portion 320 has a first surface 321 facing the base substrate 10, a second surface 322 away from the base substrate 10, and a third surface 323 connecting the first surface 321 to the second surface 322. The third surface 323 of the second conductor portion 320 has a slope angle θ3 in a range of 55° to 65° with respect to the plane where the base substrate 10 is located. For example, θ3 may be in a range of 58° to 62°. In some embodiments, θ3 may be about 60°.

A sidewall of the second via hole V2 in the inorganic layer 350 of the peripheral region has a slope angle θ1 in a range of 80° to 90° with respect to the plane where the base substrate 10 is located. For example, θ1 may be in a range of 83° to 87°. In some embodiments, θ1 may be about 85°.

An edge of the third conductor portion 330 has a first surface 331 facing the base substrate 10, a second surface 332 away from the base substrate 10, and a third surface 333 connecting the first surface 331 to the second surface 332. The third surface 333 of the third conductor portion 330 has a slope angle θ4 in a range of 58° to 67° with respect to the plane where the base substrate 10 is located. For example, θ4 may be in a range of 60° to 64°. In some embodiments, θ4 may be about 62°.

In some embodiments, the slope angle θ2 is the smallest among the slope angles θ1, θ2, θ3, θ4 and θ5. As a result, the level difference caused by the edge of the first conductor portion 310 in the process is relatively small, so that the surface of the pad is relatively flat.

In some other embodiments, the above mentioned first conductor portion 310, the second conductor portion 320, the third conductor portion 330, the first via hole V1 and the second via hole V2 may have any angle with respect to the plane where the base substrate 10 is located, which is not limited here.

Although the projections of the first conductor portion 310, the second conductor portion 320, the third conductor portion 330, the first via hole V1 and the second via hole V2 on the base substrate 10 in FIG. 3 are all rectangular, which means that the projection of the pad on the base substrate is a rectangle, the embodiments of the present disclosure are not limited thereto. The projection of the pad (e.g. at least one of the input pad and the output pad) on the base substrate may be set to have other shapes as required, such as but not limited to a parallelogram, a square, a trapezoid, or other polygons, which is not limited in the present disclosure.

It may be seen from FIG. 4C that there is a certain distance between the edge of the projection of the first conductor portion 310 on the base substrate 10 and the edge of the projection of inorganic layer 350 of the peripheral region on the base substrate 10. Accordingly, a protrusion P' formed in the third conductor portion 330 in the direction perpendicular to the base substrate 10 is much smaller than the protrusion P shown in FIG. 2B, thereby reducing the metal level difference of the third conductor portion 330 and thus reducing the risk of layer crack during the bonding process of the display substrate.

Figure 5A:
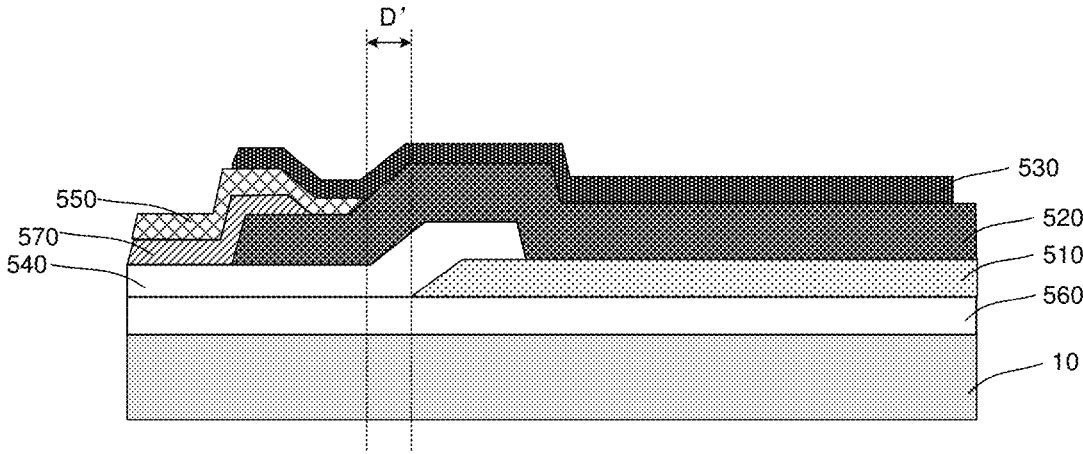
FIG. 5A shows a cross-sectional view of a pad of a display substrate according to another embodiment of the present disclosure.
Figure 5B:
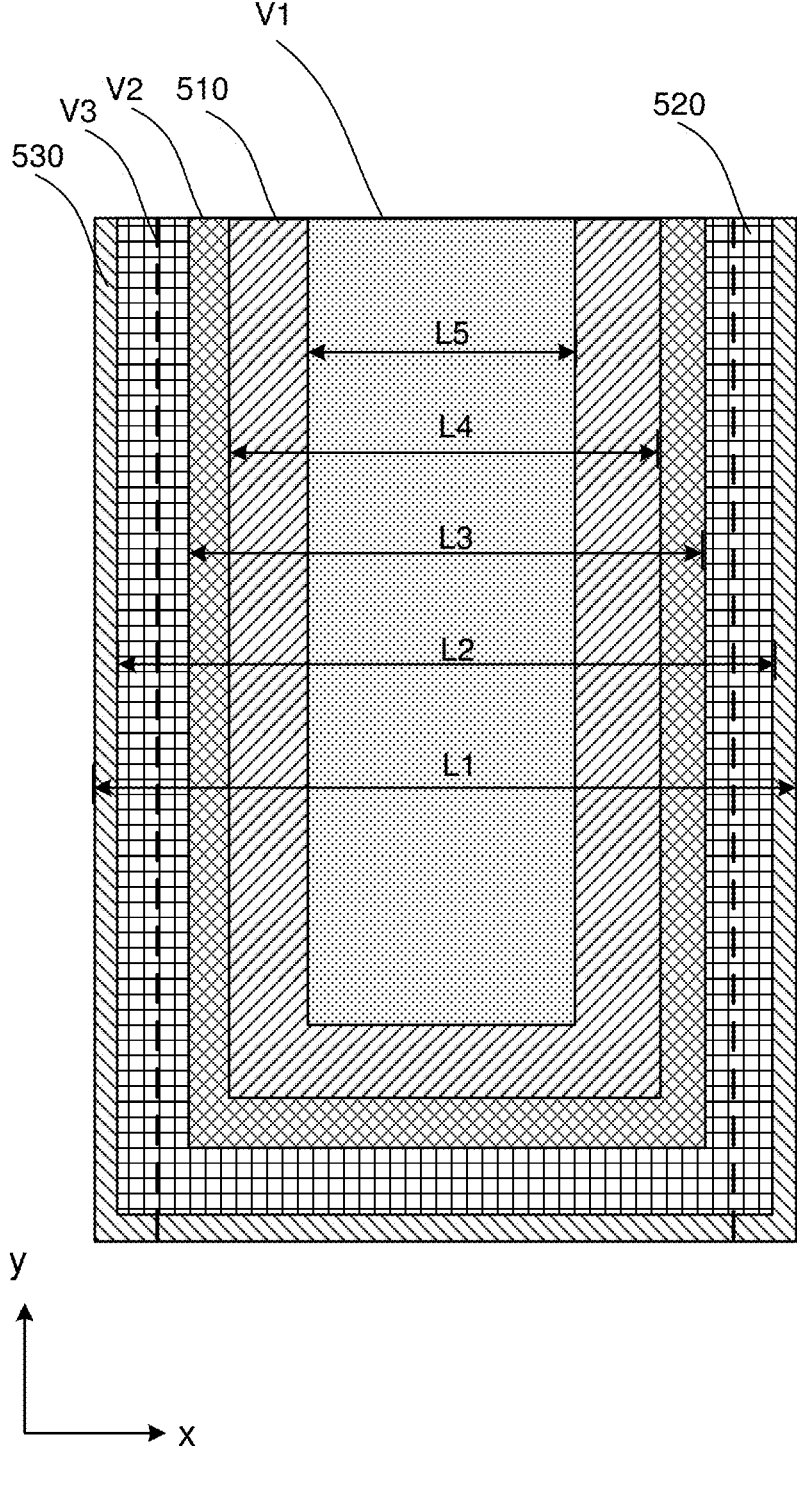
FIG. 5B shows an enlarged plan view of the pad of the display substrate of FIG. 5A.

FIG. 5A shows a cross-sectional view of a pad of a display substrate according to another embodiment of the present disclosure. FIG. 5B shows an enlarged plan view of the pad of the display substrate of FIG. 5A.

Similar to the structure of the pad of FIG. 4A, the pad of FIG. 5A includes a substrate 10 and a first gate insulating layer 560, a first conductor portion 510, an insulating layer 570 of the peripheral region, a second conductor portion 520, an inorganic layer 550 of the peripheral region and a third conductor portion 530 that are stacked on the substrate 10 in sequence. The first gate insulating layer 560, the first conductor portion 510, the insulating layer 570 of the peripheral region, the second conductor portion 520, the inorganic layer 550 of the peripheral region and the third conductor portion 530 may be implemented respectively by the first gate insulating layer 360, the first conductor portion 310, the insulating layer 340 of the peripheral region, the second conductor portion 320, the inorganic layer 350 of the peripheral region and the third conductor portion 330 as described above, which will not be repeated here.

The pad of FIG. 5A differs from the pad of FIG. 4A at least in that a planarization layer 570 of the peripheral region is further provided in the peripheral region of the display substrate. The planarization layer 570 of the peripheral region is located on a side of the inorganic layer 550 of the peripheral region facing the base substrate 10. As shown in FIG. 5A in combination with FIG. 5B, the inorganic layer 550 of the peripheral region is in contact with the second conductor portion 520 through a third via hole V3 disposed in the planarization layer 570 of the peripheral region.

As shown in FIG. 5A and FIG. 5B, the planarization layer 570 of the peripheral region is disposed between the insulating layer 540 of the peripheral region and the inorganic layer 550 of the peripheral region. A projection of the planarization layer 570 of the peripheral region on the base substrate 10 at least partially overlaps a projection of the second conductor portion 520 on the base substrate 10. As may be seen from FIG. 5A and FIG. 5B, the planarization layer 570 of the peripheral region covers at least an edge of the second conductor portion 520. It may further be seen from FIG. 5A and FIG. 5B that the projection of the planarization layer 570 of the peripheral region on the base substrate 10 at least partially overlaps a projection of the inorganic layer 550 of the peripheral region on the base substrate 10. An edge of the projection of the planarization layer 570 of the peripheral region on the base substrate 10 is located within the projection of the inorganic layer 550 of the peripheral region on the base substrate 10, that is, the inorganic layer 550 of the peripheral region at least covers the edge of the planarization layer 570 of the peripheral region. This may prevent the planarization layer 570 of the peripheral region from absorbing water due to being exposed, thereby avoiding the occurrence of IC Peeling.

As shown in FIG. 5A and FIG. 5B, there is a certain distance D' between an edge of the projection of the first conductor portion 510 on the base substrate 10 and an edge of the projection of the second via hole V2 on the base substrate 10. The distance D' may be equal to the distance D shown in FIG. 4A, for example, the distance D' may be in the range of 1 μm to 2 μm.

Figure 6:
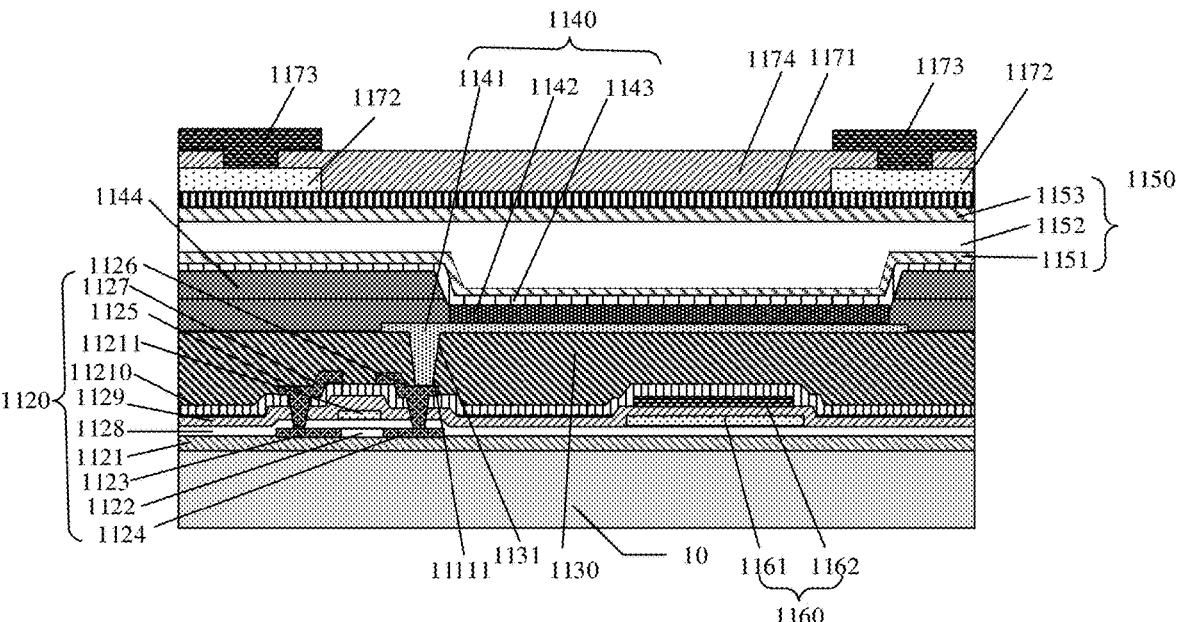
FIG. 6 shows a cross-sectional view of a display region of a display substrate according to an embodiment of the present disclosure.

FIG. 6 shows a cross-sectional view of a display region of a display substrate according to an embodiment of the present disclosure.

As shown in FIG. 6, the sub-pixel in the display region 11 may include a thin film transistor 1120, a first planarization layer 1130 of the display region, and a light-emitting element 1140.

The thin film transistor 1120 includes an active layer 1122 located on the base substrate 10, a first gate insulating layer

1128 of the display region located on a side of the active layer 1122 away from the base substrate 10, a gate electrode 11211 located on the first gate insulating layer 1128 of the display region, a second gate insulating layer 1129 of the display region on a side of the gate electrode 11211 away from the base substrate 10, an interlayer insulating layer 11210 of the display region on the second gate insulating layer 1129 of the display region, and a source electrode 1125 and a drain electrode 1126 located on the interlayer insulating layer 11210 of the display region. The gate electrode 11211 may be disposed in the same layer as a first conductor portion (310, 510) in the bonding region 12. The source electrode 1125 and the drain electrode 1126 may be disposed in the same layer as the second conductor portion (320, 520) in the bonding region 12. Therefore, the gate electrode 11211 and the first conductor portion (310, 510) may be formed in the same layer in a manufacturing process, for example, formed by using the same material layer through a patterning process. The source electrode 1125 as well as the drain electrode 1126 and the second conductor portion (320, 520) in the bonding region 12 may be formed in the same layer in the manufacturing process, for example, formed by using the same material layer through the patterning process. The first gate insulating layer 1128 of the display region in the bonding region 11 is disposed in the same layer as the gate insulating layer (360, 560) in the bonding region 12. The insulating layer (340, 540) of the peripheral region in the bonding region 12 is disposed in the same layer as the insulating layer of the display region in the display region 11, wherein the insulating layer of the display region includes the second insulating layer 1129 of the display region and the interlayer insulating layer 11210 of the display region shown in FIG. 6. In some embodiments, the insulating layer of the peripheral region includes an interlayer insulating layer of the peripheral region and a second gate insulating layer of the peripheral region. The interlayer insulating layer of the peripheral region is disposed in the same layer as the interlayer insulating layer 11210 of the display region. The second gate insulating layer 1129 of the peripheral region is disposed in the same layer as the second gate insulating layer 1129 of the display region.

In some examples of the above-described embodiments of the present disclosure, the active layer 1122 may include a source region 1123, a drain region 1124 and a channel region between the source region 1123 and the drain region 1124. Each of the interlayer insulating layer 11210 of the display region, the second gate insulating layer 1129 of the display region and the first gate insulating layer 1128 of the display region has a via hole to expose the source region 1123 and the drain region 1124. The source electrode 1125 and the drain electrode 1126 are respectively electrically connected to the source region 1123 and the drain region 1124 through the via hole. The gate electrode 11211 overlaps the channel region between the source region 1123 and the drain region 1124 in the active layer 1122 in the direction perpendicular to the base substrate 10. The first planarization layer 1130 of the display region is located above the source electrode 1125 and the drain electrode 1126 for planarizing a surface of the thin film transistor 1120 on a side away from the base substrate. A via hole 1131 is formed in the first planarization layer 1130 of the display region to expose the source electrode 1125 or the drain electrode 1126 (the case shown in the figure). In some embodiments, a material of the active layer 1122 may include polysilicon or an oxide semiconductor (such as indium gallium zinc oxide). A material of the gate electrode 11211 may include the metal material or the alloy material, such as the metal single-layer structure or the metal multi-layer structure formed by molybdenum, aluminum, and titanium. For example, the multi-layer structure is a multi-metal stack layer (such as a three-layer metal stack of titanium, aluminum and titanium, Ti/Al/Ti). A material of the source electrode 1125 and the drain electrode 1126 may include the metal material or the alloy material, such as the metal single-layer structure or the metal multi-layer structure formed by molybdenum, aluminum, and titanium. For example, the multi-layer structure is the multi-metal stack layer (such as the three-layer metal stack of titanium, aluminum and titanium, Ti/Al/Ti). The embodiments of the present disclosure do not specifically limit the material of each functional layer.

In some examples of the present disclosure, as shown in FIG. 6, the thin film transistor 1120 may further include a first metal layer 1127 of the display region. The first metal layer 1127 of the display region is disposed in the same layer as the second conductor portion (320, 520). The first metal layer 1127 of the display region includes the source electrode 1125 and the drain electrode 1126 of the above-mentioned thin film transistor. The source electrode 1125 and the drain electrode 1126 are disposed in the same layer as the second conductor portion (320, 520).

In some examples of the present disclosure, as shown in FIG. 6, the light-emitting element 1140 is formed on the first planarization layer 1130 of the display region, that is, the light-emitting element 1140 is disposed on a side of the first planarization layer 1130 of the display region away from the base substrate 10. The light-emitting element 1140 includes a first electrode 1141, a light-emitting layer 1142 and a second electrode 1143. The first electrode 1141 of the light-emitting element is electrically connected to the drain electrode 1126 through the via hole 1131 in the first planarization layer 1130 of the display region. A pixel defining layer 1144 is formed on the first electrode 1141. The pixel defining layer 1144 includes a plurality of openings to define a plurality of pixel units. Each opening exposes a corresponding first electrode 1141. The light-emitting layer 1142 is disposed in the plurality of openings of the pixel defining layer 1144. The second electrode 1143 is disposed on the pixel defining layer 1144 and the light-emitting layer 1142. For example, the second electrode 1143 may be disposed in a part of display region or in the entire display region, so that the second electrode 1143 may be formed as an integral layer during the manufacturing process.

In some embodiments, a material of the first planarization layer 1130 of the display region may include inorganic insulating materials such as silicon oxide, silicon nitride, silicon oxynitride etc., or may include organic insulating materials such as polyimide, polyphthalimide, polyphthalamide, acrylic resin, benzocyclobutene or phenolic resin. The embodiments of the present disclosure do not limit it.

In some embodiments, the first electrode 1141 may include a reflective layer. The second electrode 1143 may include a transparent layer or a semitransparent layer. Thus, the first electrode 1141 may reflect light emitted from the light-emitting layer 1142, and this part of the light is emitted into an external environment through the second electrode 1143, so that light emitting efficiency may be improved. When the second electrode 1143 includes the semitransparent layer, some light reflected by the first electrode 1141 is re-reflected by the second electrode 1143, so the first electrode 1141 and the second electrode 1143 form a resonance structure, which may improve the light emitting efficiency.

For example, a material of the first electrode 1141 may include at least one transparent conductive oxide material including indium tin oxide (ITO), indium zinc oxide (IZO)

and zinc oxide (ZnO), etc. In addition, the first electrode 1141 may include a metal having high reflectivity as a reflective layer, such as silver (Ag).

In some embodiments, for an OLED, the light-emitting layer 1142 may include a small molecular organic material or a polymer molecular organic material, which may be a fluorescent light-emitting material or a phosphorescent light-emitting material, and may emit red light, green light, blue light, or white light. The light-emitting layer may further include functional layers, such as an electron injection layer, an electron transport layer, a hole injection layer, and a hole transport layer as required. For a QLED, the light-emitting layer may include a quantum dot material, such as a silicon quantum dot, a germanium quantum dot, a cadmium sulfide quantum dot, a cadmium selenide quantum dot, a cadmium telluride quantum dot, a zinc selenide quantum dot, a lead sulfide quantum dot, a lead selenide quantum dot, a indium phosphide quantum dot and an indium arsenide quantum dot, etc., and a particle size of the quantum dot is 2 nm to 20 nm.

In some embodiments, the second electrode 1143 may include various conductive materials. For example, the second electrode 1143 may include the metal material such as lithium (Li), aluminum (Al), magnesium (Mg) and silver (Ag).

In some embodiments, a material of the pixel defining layer 1144 may include organic insulating materials such as polyimide, polyphthalimide, polyphthalamide, acrylic resin, benzocyclobutene or phenolic resin, or may include inorganic insulating materials such as silicon oxide, silicon nitride, etc. The embodiments of the present disclosure do not limit it.

In addition, the display substrate further includes a storage capacitor 1160. The storage capacitor 1160 may include a first electrode 1161 and a second electrode 1162. The first electrode 1161 of the storage capacitor 1160 is disposed between the first gate insulating layer 1128 of the display region and the second gate insulating layer 1129 of the display region. The second electrode 1162 of the storage capacitor 1160 is disposed between the second gate insulating layer 1129 of the display region and the interlayer insulating layer 11210 of the display region. The first electrode 1161 and the second electrode 1162 are overlapped, and at least partially overlap in the direction perpendicular to the base substrate 10. The first electrode 1161 and the second electrode 1162 use the second gate insulating layer 1129 of the display region as a dielectric material to form the storage capacitor. The first electrode 1161 is disposed in the same layer as the gate electrode 11211 in the thin film transistor 1120 and a lead 1220 in the bonding region 12. Likewise, as described above, in a variation of the above example, the first electrode of the storage capacitor 1160 and the second electrode of the storage capacitor 1160 may further be located in other layers, thereby resulting in sub-pixels of different structures.

In another example, as a variation of the example shown in FIG. 6, the first electrode of the storage capacitor is still disposed in the same layer as the gate electrode 11211, while the second electrode of the storage capacitor is disposed in the same layer as the source electrode 1125 and the drain electrode 1126 in the thin film transistor (i.e. further located in the first metal layer 1127 of the display region), thus the first electrode of the storage capacitor and the second electrode of the storage capacitor use a stack of the second gate insulating layer 1129 of the display region and the interlayer insulating layer 11210 of the display region as the dielectric material to form the storage capacitor.

In another example, as the variation of the example shown in FIG. 6, the first electrode of the storage capacitor is no longer disposed in the same layer as the gate electrode 11211, but is located between the second gate insulating layer 1129 of the display region and the interlayer insulating layer 11210 of the display region. The second electrode of the storage capacitor is disposed in the same layer as the source electrode 1125 and the drain electrode 1126 in the thin film transistor (i.e. further located in the first metal layer 1127 of the display region), thus the interlayer insulating layer 11210 of the display region acts as the dielectric material between the first electrode of the storage capacitor and the second electrode of the storage capacitor use so as to form the storage capacitor.

In some examples of the present disclosure, as shown in FIG. 6, the display substrate may further include an encapsulation layer 1150 disposed on the light-emitting element 1140. The encapsulation layer 1150 seals the light-emitting element 1140 so that deterioration of the light-emitting element 1140 caused by moisture and/or oxygen included in the environment may be reduced or prevented. The encapsulation layer 1150 may be a single-layer structure or a composite layer structure. The composite layer structure includes a stacked structure of an inorganic layer and an organic layer. For example, the encapsulation layer 1150 may include a first inorganic encapsulation layer 1151, a first organic encapsulation layer 1152 and a second inorganic encapsulation layer 1153 which are disposed in sequence. The encapsulation layer 1150 may extend to the bonding region 12, which does not cover the pad in the above example.

For example, a material of the encapsulation layer may include insulating materials such as silicon nitride, silicon oxide, silicon oxynitride, and polymer resin. The inorganic materials such as silicon nitride, silicon oxide and silicon oxynitride have a high compactness and may prevent the intrusion of water and oxygen. A material of the organic encapsulation layer may be a polymer material containing a desiccant or a polymer material that may block water vapor, etc. For example, the polymer resin may planarize a surface of the display substrate, may relieve a stress of the first inorganic encapsulation layer and a stress of the second inorganic encapsulation layer, and may further include water-absorbing materials such as the desiccant to absorb substances intruding inside, such as water and oxygen.

In some examples of the present disclosure, as shown in FIG. 6, the display substrate may further include a barrier layer 1171 of the display region. The barrier layer 1171 of the display region is located on a side of the encapsulation layer 1150 away from the base substrate 10. A first touch electrode layer 1172 is located on a side of the barrier layer 1171 of the display region away from the base substrate 10. A touch insulating layer 1174 is located on a side of the first touch electrode layer 1172 away from the base substrate 10 and covers the first touch electrode layer 1172. A second touch electrode layer 1173 is located on a side of the touch insulating layer 1174 away from the base substrate 10. In FIG. 6, the second touch electrode layer 1173 is electrically connected to the first touch electrode layer 1172 through a via hole in the touch insulating layer 1174. The embodiments of the present disclosure are not limited thereto. The first touch electrode layer 1172 and the second touch electrode layer 1173 may be set in other patterns as required. The first touch electrode layer 1172 and the second touch electrode layer 1173 may be configured to achieve a capacitive touch structure. The capacitive touch structure is a self-capacitance type or a mutual capacitance type.

The above-mentioned third conductor portion (330, 530) located in the bonding region 12 may be disposed in the same layer as the second touch electrode layer 1173 of the display region. The above-mentioned inorganic layer (350, 550) of the peripheral region located in the bonding region 12 may be disposed in the same layer as the touch insulating layer 1174 of the display region.

In some embodiments, the third conductor portion (330, 530) may be disposed in the same layer as the first touch electrode layer 1172 of the display region. For example, the third conductor portion (330, 530) may be formed by using the same material layer through the patterning process as the first touch electrode layer 1172 of the display region, thereby simplifying the manufacturing process.

In some embodiments, the third conductor portion (330, 530) may include a first sub-section of the third conductor and a second sub-section of the third conductor stacked in sequence in the direction perpendicular to the base substrate 10. The first sub-section of the third conductor is disposed in the same layer as the first touch electrode layer 1172. The second sub-section of the third conductor is disposed in the same layer as the second touch electrode layer 1173.

Figure 7:
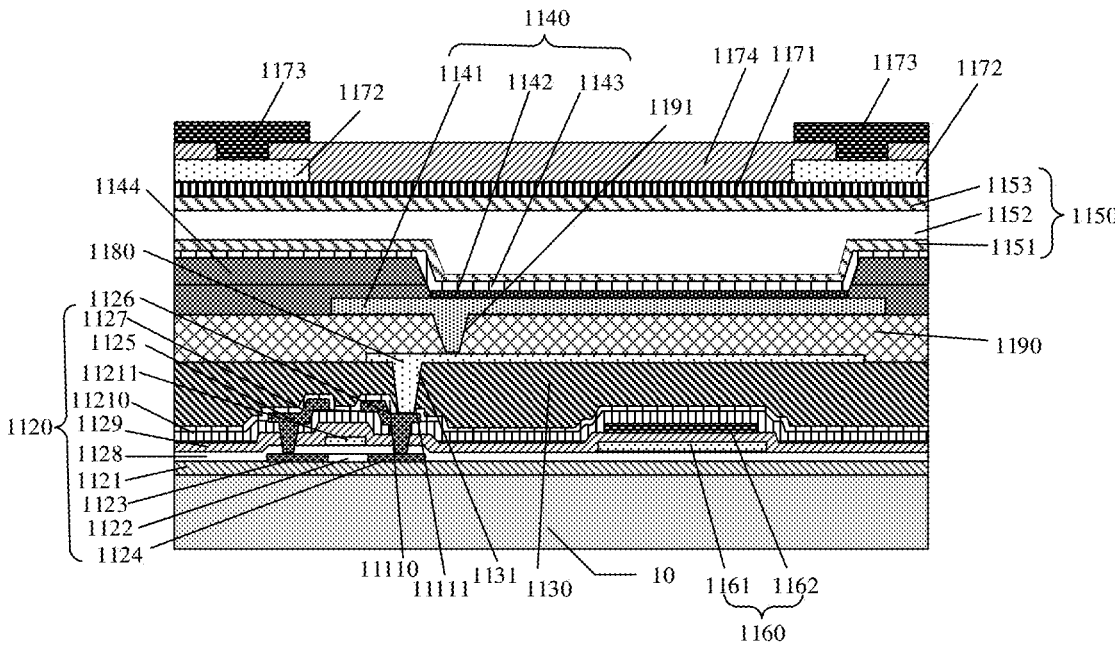
FIG. 7 shows a cross-sectional view of a display region of a display substrate according to another embodiment of the present disclosure.

FIG. 7 shows a cross-sectional view of a display region of a display substrate according to another embodiment of the present disclosure. The display region structure of FIG. 7 is different from the display region structure of FIG. 6 at least in that the display substrate further includes a transfer electrode 1180, a second planarization layer 1190 of the display region and a passivation layer 11110 of the display region. In order to simplify the description, the different parts will be mainly described in detail below.

The transfer electrode 1180 is disposed on the first planarization layer 1130 of the display region. The transfer electrode 1180 is electrically connected to the drain electrode 1126 through the via hole 1131. Due to the transfer electrode 1180, it is possible to avoid directly forming a straight via hole with an excessively large diameter in the first planarization layer 1130 of the display region and the second planarization layer 1190 of the display region, so as to improve the quality of the electrical connection through via holes. Meanwhile, the transfer electrode 1180 may be formed in the same layer as other signal lines (such as a power line, etc.), in order to avoid adding process steps.

In some embodiments, the pad in the bonding region 12 may further include a conductor structure in addition to the first conductor portion, the second conductor portion and the third conductor portion. The conductor structure is located on a side of the second conductor portion away from the base substrate and is electrically connected to the second conductor portion. The transfer electrode 1180 may be disposed in the same layer as the conductor structure of the pad. Therefore, the transfer electrode 1180 and the conductor structure may be formed in the same layer in the preparation process, for example, formed by using the same material layer through the patterning process, thereby simplifying the manufacturing process.

In some embodiments, the second conductor portion (320, 520) may be disposed in the same layer as the transfer electrode 1180. Therefore, the transfer electrode 1180 and the second conductor portion (320, 520) may be formed in the same layer in the preparation process, for example, formed by using the same material layer through the patterning process, thereby simplifying the manufacturing process.

In some embodiments, the second conductor portion (320, 520) may include a first sub-section of the second conductor and a second sub-section of the second conductor stacked in sequence in the direction perpendicular to the base substrate 10. The first sub-section of the second conductor is disposed in the same layer as at least one of the source electrode 1125 and the drain electrode 1126. The second sub-section of the second conductor is disposed in the same layer as the transfer electrode 1180.

For example, a material of the transfer electrode 1180 may include the metal material or the alloy material, such as the metal single-layer structure or the metal multi-layer structure formed by molybdenum, aluminum, and titanium.

In some examples of the present disclosure, as shown in FIG. 7, the second planarization layer 1190 of the display region is disposed on a side of the transfer electrode 1180 away from the base substrate 10 to provide a planarization surface on the side of the transfer electrode 1180 away from the base substrate 10. A via hole 1191 is formed in the second planarization layer 1190 of the display region. The first electrode 1141 of the light-emitting element is electrically connected to the transfer electrode 1180 through the via hole 1191 disposed in the second planarization layer 1190 of the display region.

The passivation layer 11110 of the display region is located between the thin film transistor 1120 and the first planarization layer 1130 of the display region. A via hole 11111 may be provided in the passivation layer 11110 of the display region. The passivation layer 11110 of the display region may protect the source electrode and the drain electrode of the thin film transistor from being corroded by water vapor. In some embodiments, the passivation layer 11110 of the display region may be thinned, or the passivation layer 11110 of the display region may be omitted.

Figure 8:
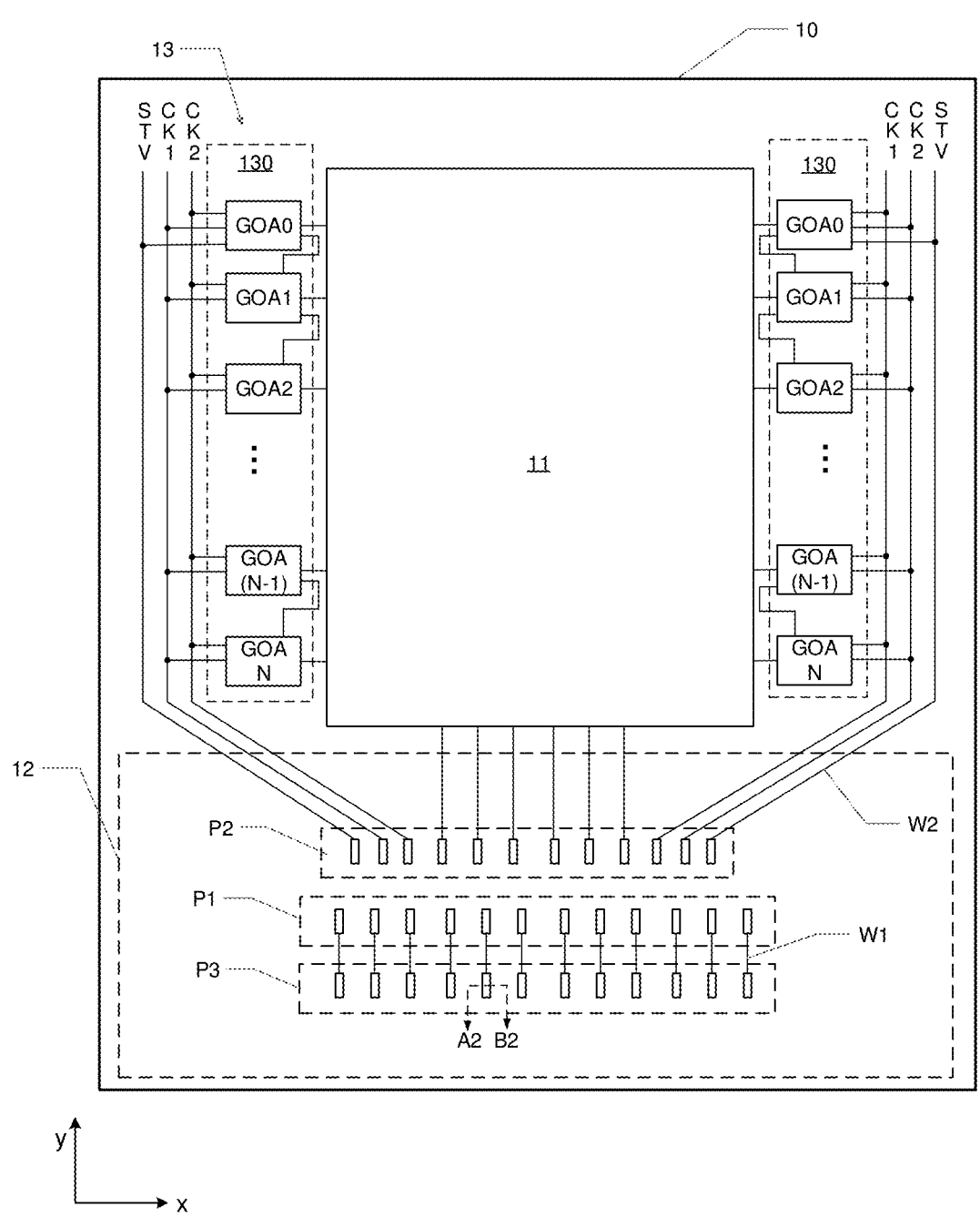
FIG. 8 shows a schematic plan view of a display substrate according to another embodiment of the present disclosure.

FIG. 8 shows a schematic plan view of a display substrate according to another embodiment of the present disclosure. The display substrate of FIG. 8 is similar to the display substrate of FIG. 1A, except that the display substrate of FIG. 8 further includes a plurality of connection pads P3. In order to simplify the description, the different parts will be mainly described in detail below.

As shown in FIG. 8, a plurality of connection pads P3 are located in the bonding region 12. The connection pads P3 are located on a side of the plurality of input pads P1 away from the display region 11. A first conductor portion of the input pad P1 is electrically connected to the connection pad P3 through a first lead W1 disposed in the bonding region 12. The plurality of connection pads P3 may be used to be connected with the external circuit, e.g. via the flexible circuit board.

Figure 9:
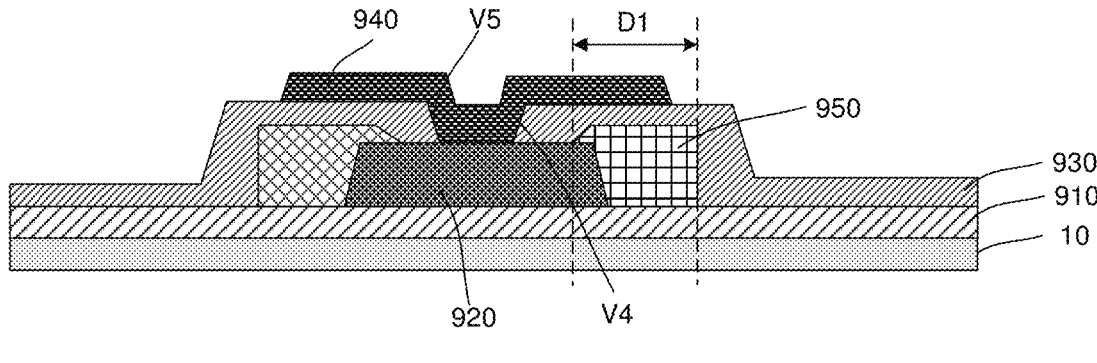
FIG. 9 shows a cross-sectional view of an example of a connection pad of the display substrate of FIG. 8 along A2-B2.

FIG. 9 shows a cross-sectional view of an example of a connection pad of the display substrate of FIG. 8 along A2-B2. A structure of the connection pad of FIG. 9 is applicable to the display substrate of any of the above embodiments.

As shown in FIG. 9, the connection pad P3 includes a fourth conductor portion 920 and a fifth conductor portion 940. The fourth conductor portion 920 is located on the base substrate 10 and is disposed in the same layer as the aforementioned second conductor portion (320, 520). The fifth conductor portion 940 is located on a side of the fourth conductor portion 920 away from the base substrate 10. The fifth conductor portion 940 may be disposed in the same layer as the aforementioned third conductor portion (330, 530). The fifth conductor portion 940 is electrically connected to the fourth conductor portion 920 through a fourth via hole V4 disposed in an inorganic layer 930 of the peripheral region. The inorganic layer 930 of the peripheral region may be disposed in the same layer as the touch insulating layer 1174 of the display region. A pad insulating portion 950 is located on a side of the inorganic layer 930 of the peripheral region facing the base substrate 10 and covers an edge of the fourth conductor portion 920. In some embodiments, a projection of the fourth conductor portion 920 on the base substrate 10 may have a shape of rectangle. A projection of the pad insulating portion 950 on the base substrate 10 may be in form of a strip surrounding four sides of the rectangular projection and partially overlapping the edge of the rectangular projection. A part of the pad insulating portion 950 covers the fourth conductor portion 920, and another part of the pad insulating portion 950 is in contact with an insulating layer 910 of the peripheral region. A sum D1 (i.e. the width of the above-mentioned strip) of the sizes of the two parts in the first direction (direction x) is in a range of 2 μm to 5 μm, for example, may be in a range of 2 μm to 3 μm.

In this embodiment, the pad insulating portion 950 is disposed in the same layer as the above-mentioned planarization layer of the peripheral region. For example, the pad insulating portion 950 may be obtained by patterning the planarization layer of the peripheral region. The inorganic layer 930 of the peripheral region is in contact with the fourth conductor portion 920 through a fifth via hole V5 disposed in the planarization layer of the peripheral region. Since most of the planarization layer of the peripheral region around the fourth conductor portion 920 is removed, the inorganic layer 930 of the peripheral region is at least partially in direct contact with the insulating layer 910 of the peripheral region. This design may eliminate a rainbow pattern caused by layer peeling. Moreover, since the pad insulating portion 950 is provided at the edge of the fourth conductor portion 920, it is possible to avoid a dark spot caused by Ag precipitation after side etching of the fourth conductor portion 920 by an anode layer.

Figure 10:
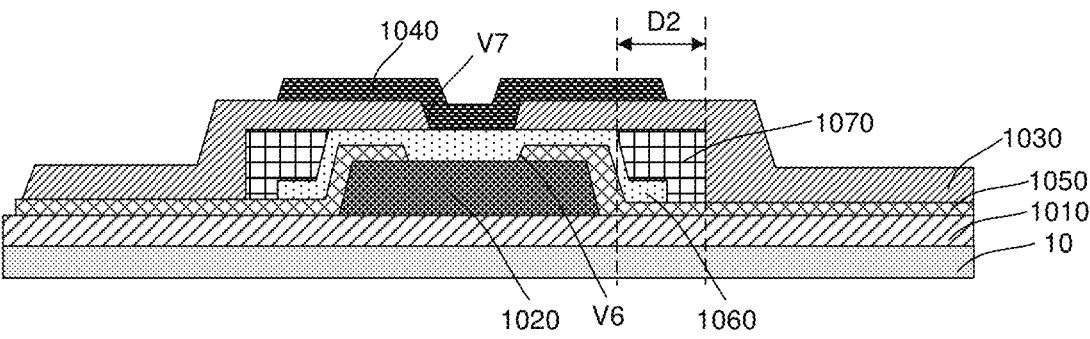
FIG. 10 shows a cross-sectional view of another example of a connection pad of the display substrate of FIG. 8 along A2-B2.

FIG. 10 shows a cross-sectional view of another example of a connection pad of the display substrate of FIG. 8 along A2-B2. A structure of the connection pad of FIG. 10 is applicable to the display substrate of any of the above embodiments. The connection pad of FIG. 10 is similar to that of FIG. 9, except that the connection pad P3 shown in FIG. 10 further includes a sixth conductor portion 1060 and a pad insulating portion 1070. In order to simplify the description, the different parts will be mainly described in detail below.

As shown in FIG. 10, the sixth conductor portion 1060 is located on a side of a fourth conductor portion 1020 away from the base substrate 10. The pad insulating portion 1070 is located on a side of an inorganic layer 1030 of the peripheral region facing the base substrate 10 and covers an edge of the sixth conductor portion 1060. The sixth conductor portion 1060 may be disposed in the same layer as the above-mentioned second touch electrode layer 1173.

A passivation layer 1050 of the peripheral region is further provided in the bonding region 12 of the display substrate of FIG. 10. The passivation layer 1050 of the peripheral region is located on a side of the sixth conductor portion 1060 facing the base substrate 10. The sixth conductor portion 1060 is electrically connected to the fourth conductor portion 1020 through a sixth via hole V6 disposed in the passivation layer 1050 of the peripheral region. A third conductor portion 1040 is in contact with the sixth conductor portion 1060 through a seventh via hole V7 disposed in the inorganic layer 1030 of the peripheral region.

The passivation layer 1050 of the peripheral region may be disposed in the same layer as the passivation layer 11110 of the display region. Therefore, the passivation layer 1050 of the peripheral region and the passivation layer 11110 of the display region may be formed in the same layer in the preparation process, for example, formed by using the same material layer through the patterning process.

A projection of the sixth conductor portion 1060 on the base substrate 10 may have a shape of rectangle. A projection of the pad insulating portion 1070 on the base substrate 10 may be in form of a strip surrounding four sides of the rectangular projection in the strip shape, partially overlapping an edge of the rectangular projection. A part of the pad insulating portion 1070 covers the sixth conductor portion 1060, and another part of the pad insulating portion 1070 is in contact with the passivation layer 1050 of the peripheral region. A sum D2 (i.e. the width of the above-mentioned strip) of the sizes of the two parts in the first direction (direction x) is in the range of 2 m to 5 μm, for example, may be in the range of 2 μm to 3 μm.

In this embodiment, the pad insulating portion 1070 is disposed in the same layer as the above-mentioned planarization layer of the peripheral region. For example, the pad insulating portion 1070 may be obtained by patterning the planarization layer of the peripheral region. Since most of the planarization layer of the peripheral region around the sixth conductor portion 1060 is removed, the inorganic layer 1030 of the peripheral region is at least partially in direct contact with the passivation layer 1050 of the peripheral region. This design may eliminate a rainbow pattern caused by layer peeling. Moreover, since the pad insulating portion 1070 is provided at the edge of the sixth conductor portion 1060, it is possible to avoid a dark spot caused by Ag precipitation after side etching of the sixth conductor portion 1060 by the anode layer.

The present disclosure further provides a display device, which may include the display substrate of any one of the above-mentioned embodiments.

For example, in some examples, the display device may further include the flexible circuit board and the control chip. For example, the flexible circuit board is bonded to the bonding region of the display substrate, and the control chip is mounted on the flexible circuit board in order to be electrically connected to the display region. Alternatively, the control chip is directly bonded to the bonding region, in order to be electrically connected to the display region.

For example, the control chip may be a central processing unit, a digital signal processor, a system-on-chip (SoC), etc. For example, the control chip may further include a memory, a power module, etc., and may implement the function of power supplying and the function of signal inputting and outputting through an additionally disposed wires and signal lines, etc. For example, the control chip may further include a hardware circuit, a computer executable code, etc. The hardware circuit may include a conventional very large scale integration (VLSI) circuit or a gate array as well as an off-the-shelf semiconductor such as a logic chip and a transistor, or other discrete components. The hardware circuit may further include a field programmable gate array, a programmable array logic, a programmable logic device, etc.

For example, the display device provided by at least one embodiment of the present disclosure may be any product or component with a display function, such as a mobile phone, a tablet computer, a TV, a monitor, a notebook computer, a digital photo frame, and a navigator.

Those skilled in the art may understand that the above-described embodiments are all exemplary. Those skilled in the art may make improvements thereto, and the structures described in the various embodiments may be freely combined in a case that there is no conflict in terms of structure or principle.

After describing the preferred embodiments of the present disclosure in detail, those skilled in the art may clearly understand that various changes and modifications may be made without departing from the scope and spirit of the appended claims, and the present disclosure is not limited to the exemplary embodiments set forth in the specification.

What is claimed is:

1. A display substrate, comprising:
a base substrate comprising a display region and a peripheral region surrounding the display region;
a plurality of sub-pixels located in the display region and arranged in an array;
a plurality of pads located in the peripheral region, wherein at least one of the plurality of pads comprises a first conductor portion, a second conductor portion and a third conductor portion, the first conductor portion is located on the base substrate, the second conductor portion is located on a side of the first conductor portion away from the base substrate and electrically connected to the first conductor portion, and the third conductor portion is located on a side of the second conductor portion away from the base substrate and electrically connected to the second conductor portion;
an insulating layer of the peripheral region, wherein the insulating layer of the peripheral region is located in the peripheral region, and the second conductor portion is electrically connected to the first conductor portion through a first via hole disposed in the insulating layer of the peripheral region; and
an inorganic layer of the peripheral region, wherein the inorganic layer of the peripheral region is located in the peripheral region, the third conductor portion is electrically connected to the second conductor portion through a second via hole disposed in the inorganic layer of the peripheral region, and a projection of the first conductor portion on the base substrate is located within a projection of the second via hole on the base substrate;
wherein the plurality of pads comprises:
a plurality of input pads arranged along a first direction in the peripheral region on a first side of the display region, wherein the first direction is a row direction of the array of the plurality of sub-pixels; and
a plurality of output pads located between the plurality of input pads and the display region and arranged along the first direction.

2. The display substrate according to claim 1, further comprising:
a planarization layer of the peripheral region, wherein the planarization layer of the peripheral region is located on a side of the inorganic layer of the peripheral region facing the base substrate, and the inorganic layer of the peripheral region is in contact with the second conductor portion through a third via hole disposed in the planarization layer of the peripheral region.

3. The display substrate according to claim 1, further comprising:
a plurality of connection pads located in the peripheral region, wherein on a side of the plurality of input pads away from the display region, the first conductor portion of the input pad is electrically connected to the connection pad through a first lead disposed in the peripheral region; and a gate driving circuit located in a peripheral region on at least a second side of the display region, wherein the gate driving circuit is connected to the plurality of sub-pixels and configured to provide a gate driving signal to the plurality of sub-pixels, wherein the first conductor portion of the output pad is electrically connected to the gate driving circuit or at least one of the plurality of sub-pixels through a second lead disposed in the peripheral region.

4. The display substrate according to claim 3, wherein the connection pad comprises:

a fourth conductor portion located on the base substrate and disposed in the same layer as the second conductor portion;

a fifth conductor portion located on a side of the fourth conductor portion away from the base substrate and disposed in the same layer as the third conductor portion, wherein the fifth conductor portion is electrically connected to the fourth conductor portion through a fourth via hole disposed in the inorganic layer of the peripheral region; and a pad insulating portion located on a side of the inorganic layer of the peripheral region facing the base substrate, wherein the pad insulating portion covers an edge of the fourth conductor portion.

5. The display substrate according to claim 4, further comprising a planarization layer of the peripheral region, wherein the inorganic layer of the peripheral region is in contact with the fourth conductor portion through a fifth via hole disposed in the planarization layer of the peripheral region, and the pad insulating portion is disposed in the same layer as the planarization layer of the peripheral region.

6. The display substrate according to claim 1, wherein an edge of the projection of the first conductor portion on the base substrate is spaced from an edge of the projection of the second via hole on the base substrate by a distance of 1 $\mu m$ to 2 $\mu m$.

7. The display substrate according to claim 6, wherein a geometric center of the projection of the first conductor portion on the base substrate substantially coincides with a geometric center of the projection of the second via hole on the base substrate, a size of the projection of the first conductor portion on the base substrate in a first direction is in a range of 12 $\mu m$ to 14 $\mu m$, a size of the projection of the second via hole on the base substrate in the first direction is in a range of 14 $\mu m$ to 16 $\mu m$, and the first direction is a row direction of the array of the plurality of sub-pixels.

8. The display substrate according to claim 2, wherein a size of a projection of the third via hole on the base substrate in a first direction is in a range of 16 $\mu m$ to 20 $\mu m$.

9. The display substrate according to claim 1, wherein a size of a projection of the first via hole on the base substrate in a first direction is in a range of 7 $\mu m$ to 9 $\mu m$.

10. The display substrate according to claim 1, wherein:

a sidewall of the second via hole in the inorganic layer of the peripheral region has a slope angle $\theta 1$ with respect to a plane where the base substrate is located; and an edge of the first conductor portion has a first surface facing the base substrate, a second surface away from the base substrate and a third surface connecting the first surface to the second surface, and the third surface of the first conductor portion has a slope angle $\theta 2$ with respect to the plane where the base substrate is located; wherein $\theta 2 < \theta 1$.

11. The display substrate according to claim 10, wherein the slope angle $\theta 1$ is in a range of 80° to 90°, and the slope angle $\theta 2$ is in a range of 20° to 30°.

12. The display substrate according to claim 1, wherein an edge of the second conductor portion has a first surface facing the base substrate, a second surface away from the base substrate and a third surface connecting the first surface to the second surface, and the third surface of the second conductor portion has a slope angle $\theta 3$ with respect to a plane where the base substrate is located;

wherein an edge of the third conductor portion has a first surface facing the base substrate, a second surface away from the base substrate and a third surface connecting the first surface to the second surface, and the third surface of the third conductor portion has a slope angle $\theta 4$ with respect to the plane where the base substrate is located;

wherein a sidewall of the first via hole in the insulating layer of the peripheral region has a slope angle $\theta 5$ with respect to the plane where the base substrate is located; and wherein $\theta 5 < \theta 3 < \theta 4$.

13. The display substrate according to claim 12, wherein the slope angle $\theta 3$ is in a range of 55° to 65°, the slope angle $04$ is in a range of 58° to 67°, and the slope angle $\theta 5$ is in a range of 40° to 50°.

14. The display substrate according to claim 1, wherein at least one of the plurality of sub-pixels comprises a thin film transistor having a gate electrode, a source electrode and a drain electrode, the first conductor portions of the plurality of pads are disposed in the same layer as the gate electrode, and the second conductor portions of the plurality of pads are disposed in the same layer as the source electrode and the drain electrode.

15. The display substrate according to claim 14, further comprising: a light-emitting element, an encapsulation layer, a first touch electrode layer, a second touch electrode layer and a touch insulating layer that are located in the display region, wherein the light-emitting element is located on a side of the thin film transistor away from the base substrate, the encapsulation layer is located on a side of the light-emitting element away from the base substrate, the first touch electrode layer is located on a side of the encapsulation layer away from the base substrate, the touch insulating layer is located on a side of the first touch electrode layer away from the base substrate and covers the first touch electrode layer, and the second touch electrode layer is located on a side of the touch insulating layer away from the base substrate;

wherein the inorganic layer of the peripheral region is disposed in the same layer as the touch insulating layer, and the third conductor portion is disposed in the same layer as at least one of the first touch electrode layer or the second touch electrode layer.

16. The display substrate according to claim 14, wherein the at least one of the plurality of sub-pixels further comprises an interlayer insulating layer of the display region, a first gate insulating layer of the display region and a second gate insulating layer of the display region, the interlayer insulating layer of the display region is located between the gate electrode and the source electrode and drain electrode, the first gate insulating layer of the display region is located on a side of the interlayer insulating layer of the display region facing the base substrate, and the second gate insulating layer of the display region is located between the interlayer insulating layer of the display region and the first gate insulating layer of the display region; and wherein the insulating layer of the peripheral region comprises an interlayer insulating layer of the peripheral region and a second gate insulating layer of the peripheral region, the interlayer insulating layer of the peripheral region is disposed in the same layer as the interlayer insulating layer of the display region, and the second gate insulating layer of the peripheral region is disposed in the same layer as the second gate insulating layer of the display region.

17. The display substrate according to claim 1, wherein at least one of the plurality of sub-pixels comprises a thin film transistor and a transfer electrode, the thin film transistor comprises a gate electrode, a source electrode and a drain electrode, the transfer electrode is electrically connected to one of the source electrode and the drain electrode, and the second conductor portion is disposed in the same layer as at least one of the source electrode and drain electrode and the transfer electrode.

18. A display device, comprising the display substrate according to claim 1.

* * * * *